US009198319B2

(12) United States Patent
Hsiao et al.

(10) Patent No.: US 9,198,319 B2
(45) Date of Patent: Nov. 24, 2015

(54) MODULAR POWER DEVICE

(71) Applicants: Yung-Hung Hsiao, New Taipei (TW); Ju-Tang Lo, New Taipei (TW); Yen-Ming Chen, New Taipei (TW); Hao-Te Hsu, New Taipei (TW); Pei-Li Chang, New Taipei (TW); Chia-Hsien Yen, New Taipei (TW); Shin-Bin Lin, New Taipei (TW); Yu-Hsuan Wu, New Taipei (TW); Chin-Hang Lee, New Taipei (TW); Huei-Fang Lin, New Taipei (TW); Ping-Yu Chen, New Taipei (TW); Chi-Chang Ho, New Taipei (TW)

(72) Inventors: Yung-Hung Hsiao, New Taipei (TW); Ju-Tang Lo, New Taipei (TW); Yen-Ming Chen, New Taipei (TW); Hao-Te Hsu, New Taipei (TW); Pei-Li Chang, New Taipei (TW); Chia-Hsien Yen, New Taipei (TW); Shin-Bin Lin, New Taipei (TW); Yu-Hsuan Wu, New Taipei (TW); Chin-Hang Lee, New Taipei (TW); Huei-Fang Lin, New Taipei (TW); Ping-Yu Chen, New Taipei (TW); Chi-Chang Ho, New Taipei (TW)

(73) Assignee: CHICONY POWER TECHNOLOGY CO., LTD., New Taipei (TW)

( * ) Notice: Subject to any disclaimer, the term of this patent is extended or adjusted under 35 U.S.C. 154(b) by 538 days.

(21) Appl. No.: 13/647,385

(22) Filed: Oct. 9, 2012

(65) Prior Publication Data
US 2014/0022737 A1 Jan. 23, 2014

(30) Foreign Application Priority Data
Jul. 23, 2012 (TW) .............................. 101126470 A

(51) Int. Cl.
*H05K 5/00* (2006.01)
*H05K 7/14* (2006.01)

(52) U.S. Cl.
CPC .................................. *H05K 7/1432* (2013.01)

(58) Field of Classification Search
CPC ................................ H05K 1/18; H05K 7/1432
USPC .......................................... 361/753, 783, 781
See application file for complete search history.

(56) References Cited

U.S. PATENT DOCUMENTS

| 6,246,016 | B1 * | 6/2001 | Roessler et al. | 174/261 |
|---|---|---|---|---|
| 7,554,796 | B2 * | 6/2009 | Coffey et al. | 361/643 |
| 8,344,842 | B1 * | 1/2013 | Luzanov | 336/192 |
| 2009/0085219 | A1 * | 4/2009 | Bayerer | 257/776 |
| 2009/0086427 | A1 * | 4/2009 | Okumura et al. | 361/690 |
| 2010/0053850 | A1 | 3/2010 | Coffey et al. | |
| 2012/0026698 | A1 * | 2/2012 | Chan et al. | 361/748 |
| 2014/0098498 | A1 * | 4/2014 | Huang et al. | 361/720 |

FOREIGN PATENT DOCUMENTS

CN 101581914 B 6/2011

OTHER PUBLICATIONS

Office Action of Corresponding Taiwan patent application dated Jul. 17, 2014.

* cited by examiner

*Primary Examiner* — Yuriy Semenenko
(74) *Attorney, Agent, or Firm* — Chun-Ming Shih; HDLS IPR Services

(57) ABSTRACT

A modular power device is used for mounting on a main plate. The modular power device includes a first substrate, a driving module and a converting module. The first substrate having a first axial direction and a second axial direction substantially perpendicular to the first axial direction is inserted into the main plate, such that the second axial direction is substantially perpendicular to the main plate. The driving module is located on one side of the first substrate and electrically connected thereon. The converting module is located on the other side of the first substrate and electrically connected to the driving module. A length of the converting module is substantially equal to that of the first substrate in the first axial direction, and a width of the converting module is smaller than a length of the first substrate in the first axial direction.

5 Claims, 12 Drawing Sheets

MODULAR POWER DEVICE

This application is based on and claims the benefit of Taiwan Application No. 101126470 filed Jul. 23, 2012 the entire disclosure of which is incorporated by reference herein.

BACKGROUND OF THE INVENTION

1. Field of the Invention

The present invention relates to a power device and a power system and in particular to a modular power device and a modular power system.

2. Description of Prior Art

Power supply devices are the essential components of industrial equipment, and are used for converting alternating current (AC) electric power into direct current (DC) electric power or providing functions of bucking or boosting. A conventional power supply device includes a flat circuit board, at least one converter and a plurality of electrical components. The converter and the electrical components are individually placed on the circuit board and electrically connected to thereto via traces formed on the circuit board.

While the demanded functions of industrial equipment increased, the internal devices which are disposed within the industrial equipment are increased accordingly. In order to sufficiently driving the internal devices, the output power of the power supply device must be increased simultaneously. When the outputting power of the power supply device is increased, the tolerance (such as rated working voltage) of the converter and the electronic components may also be increased. The volume of part of electronic component, such as capacitor, is direct proportion to the rated working voltage, namely, the larger rated working voltage and the greater volume. While the electronic components with greater volume are placed on the circuit board, will occupy a lot of space in the circuit board, this becomes the main reason of the high power supply system cannot miniaturization.

SUMMARY OF THE INVENTION

It is an object to provide a modular power device with small volume.

It is another object to provide a power system with the modular power device mentioned above.

Accordingly, the module power device according to one aspect of the present invention is used for mounted on a main plate. The module power device comprises a first substrate, a driving module and a converting module. The first substrate has a first axial direction and a second axial direction substantially perpendicular to the first axial direction. The first substrate is inserted into the main plate, such that the second axial direction of the first substrate is perpendicular to the main plate. The driving module is placed on one side of the first substrate and electrically connected to the first substrate. The converting module is located on the other side of the first substrate and electrically connected to the driving module. A length of the converting module is substantially equal to that of the first substrate in the first axial direction, and a width of the converting module is smaller than a length of the first substrate in the first axial direction.

Accordingly, the power system according to another aspect of the present invention comprises a main plate and a plurality of modular power devices. The modular power devices are electrically connected in parallel are mounted on the main plate.

In the present invention, the first substrate of the modular power device is directly inserted into the main plate and substantially perpendicular to the main plate. The driving module and the converting module are respectively located at two side of the first substrate, and the driving module is directly is placed on first substrate. Thereby, the volume of the modular power device can be substantially reduced, and prevent outputting electric power by interference from inputting electric power. Besides, the route for transmitting current is also reduced.

BRIEF DESCRIPTION OF DRAWING

The features of the invention believed to be novel are set forth with particularity in the appended claims. The invention itself however may be best understood by reference to the following detailed description of the invention, which describes certain exemplary embodiments of the invention, taken in conjunction with the accompanying drawings in which:

FIG. 9 is a perspective view of a modular power module according to a forth embodiment of the present invention.

DETAILED DESCRIPTION OF THE INVENTION

A preferred embodiment of the present invention will be described with reference to the drawings.

Figure 1:
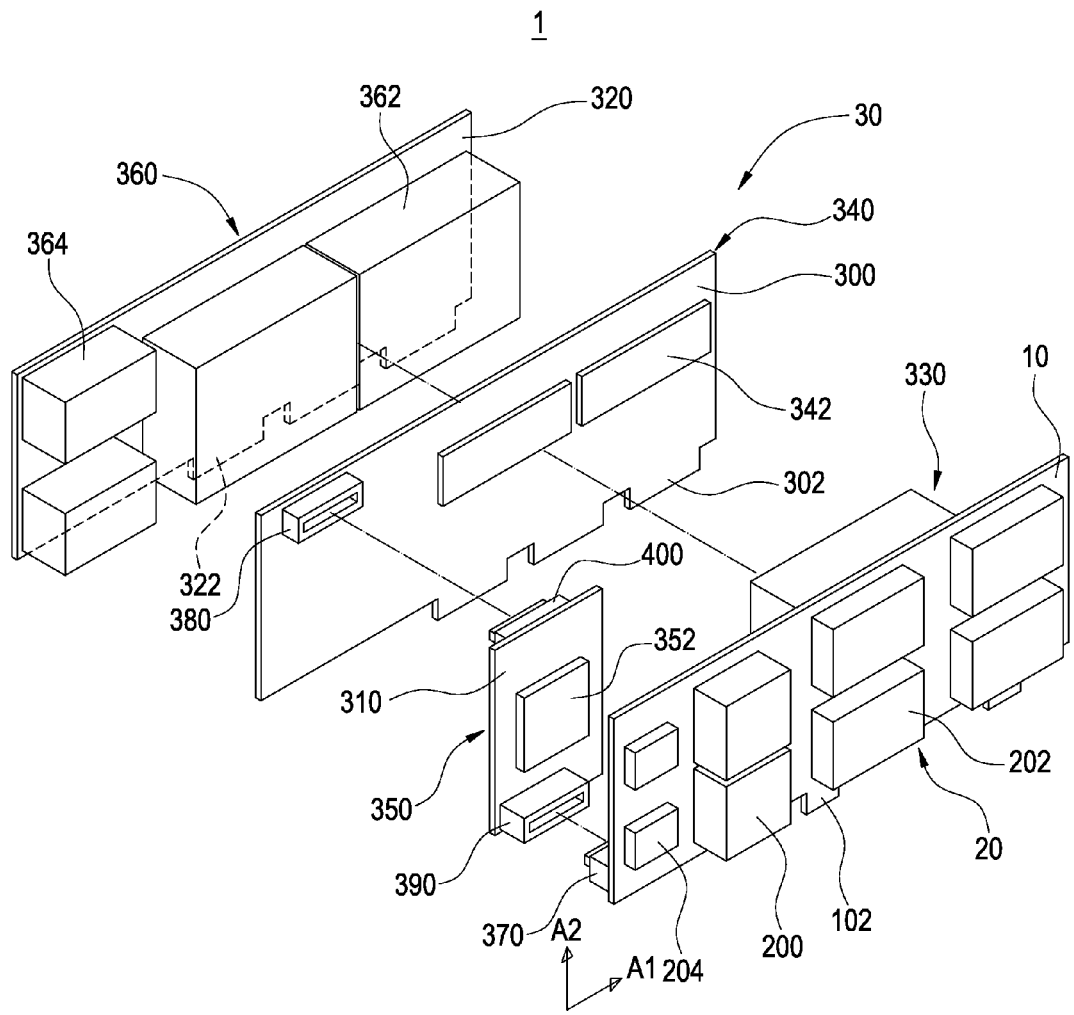
FIG. 1 is a perspective view of a modular power device according to a first embodiment of the present invention.
Figure 2:
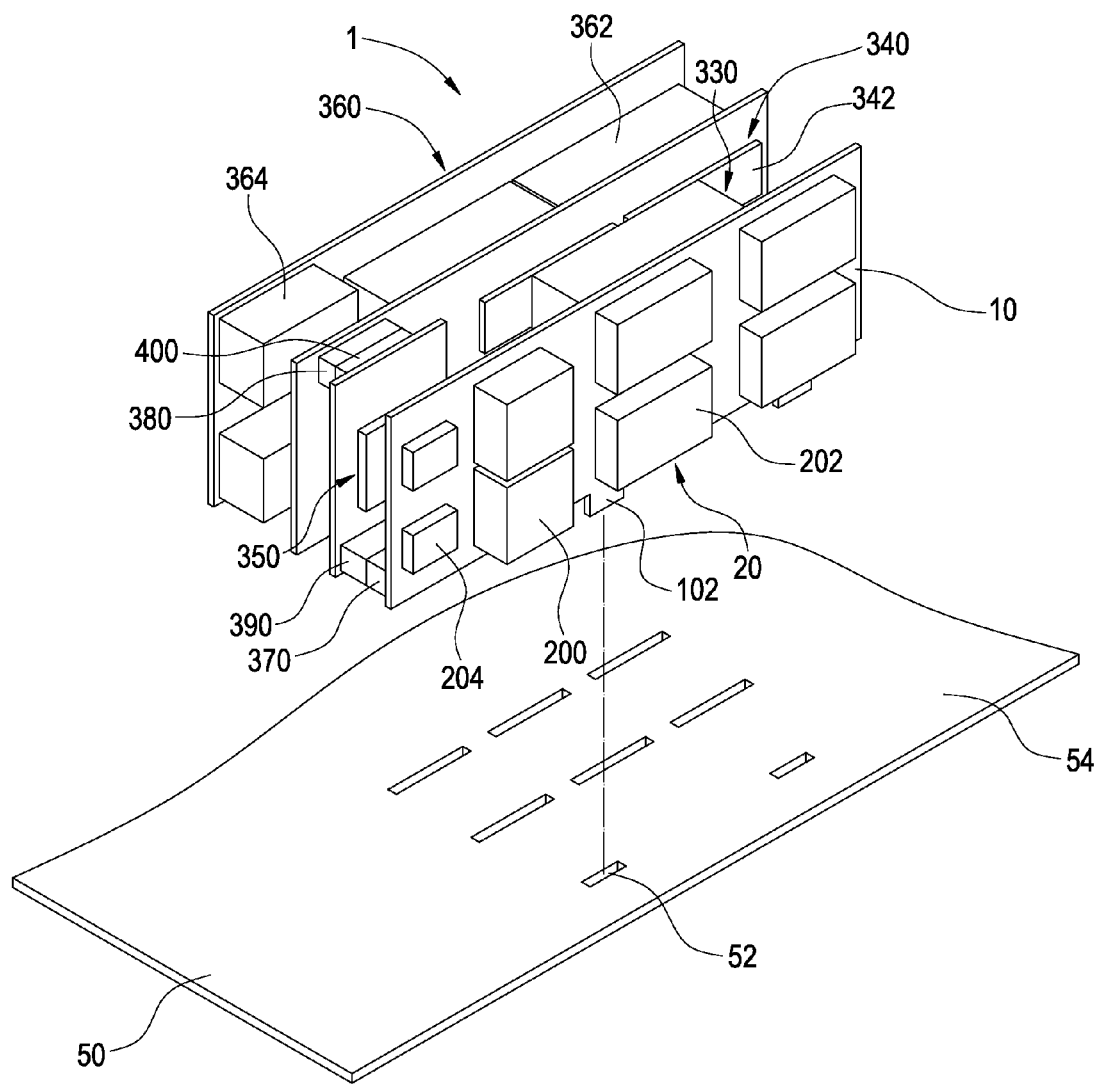
FIG. 2 is a perspective view of a modular power device and a main plate according to a first embodiment of the present invention.
Figure 3:
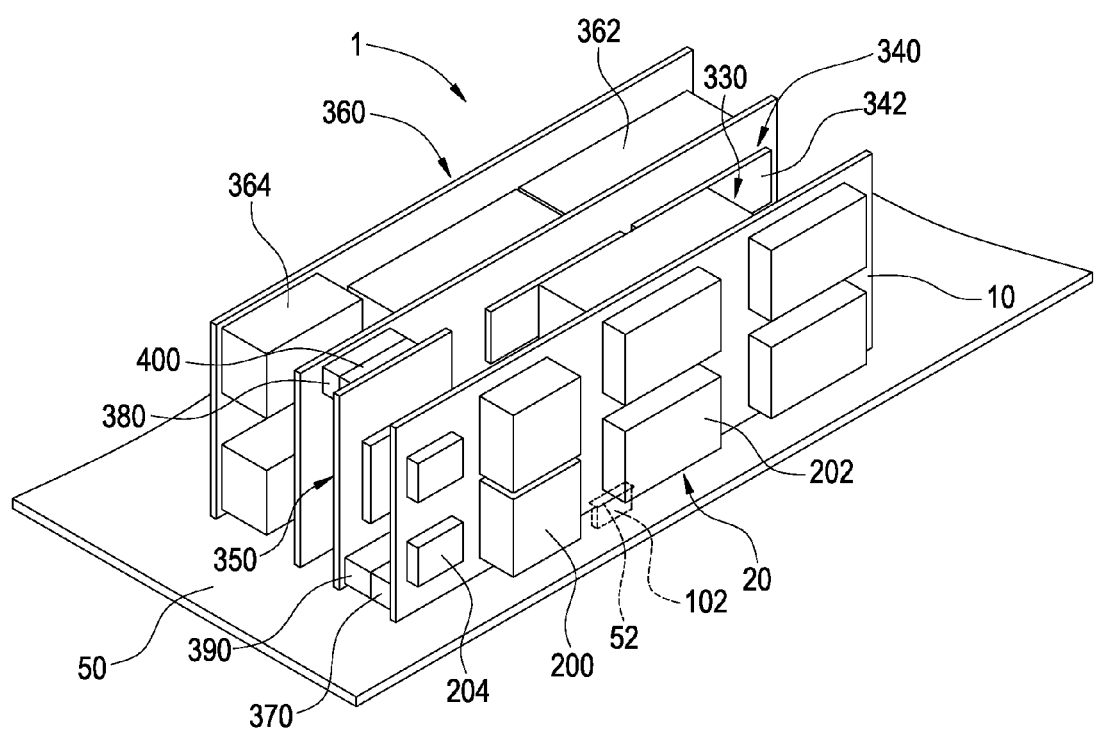
FIG. 3 is an assemble view of the modular power device and the main board according to the first embodiment of the present invention.

Referring to FIG. 1 to FIG. 3, FIG. 1 is a perspective view of a modular power device according to a first embodiment of the present invention, FIG. 2 is a perspective view of a modular power module and a main plate according to a first embodiment of the present invention, and FIG. 3 is an assemble view of the module power device and the main plate according to the first embodiment of the present invention. The modular power device 1 is used for mounting on a main plate 50. The main plate 50 has a plurality of grooves 52 for the modular power device 1 to be inserted therein. The main plate 50 may be a printed circuit board (PCB) or a substrate provided with conductive traces (not shown), and the substrate mentioned above may be copper substrate, aluminum substrate, ceramic substrate or other substrate with good thermal conductivity. However, the main plate 50 may also be combined PCB with copper slice or other material with good electrical conductivity.

The modular power device 1 includes a first substrate 10, a driving module 20 and a converting module 30. The driving module 20 is placed on one side of the first substrate 10 and electrically connected to the first substrate 10. The converting module 30 is located on the other side of the first substrate 10 and electrically connected to the driving module 20.

The first substrate 10 is a PCB or a substrate provided with conductive traces (not shown). In more particular, the substrate mentioned above may be copper substrate, aluminum substrate, ceramic substrate or other substrate with good thermal conductivity. However, the first substrate 10 may also be combined PCB with copper slice or other material with good electrical conductivity.

The first substrate 10 has a first axial direction A1 and a second axial direction A2 substantially perpendicular to the first axial direction A1. In this embodiment, the first axial direction A1 is lengthwise direction of the first substrate 10, and the second axial direction A2 is widthwise direction of the first substrate 10. The first substrate 10 is inserted into the main plate 50, such that the second axial direction A2 of the first substrate 10 is substantially perpendicular to a board 54 of the main plate 50. An end of the first substrate 10 has at least one pillar 102. The first substrate 10 can include one or more pillars 102. As non-limiting examples, the first substrate 10 includes two pillars 102. The pillars 102 are inserted into the grooves 52, such that the first substrate 10 is substantially perpendicular to the main plate 50 and electrically connected thereto.

The driving module 20 is directly placed on the first substrate 10 and electrically connected thereto for receiving electric power inputting to the modular power device 10 and driving the modular power device 10. The driving module 20 includes at least one converter 200, at least one switching component 202 and a plurality of active or passive components 204. The driving module 20 can include one or more converters 200 and switch components 202, respectively. As a non-limiting example, the driving module 20 of the modular power device 1 includes two converters 200 and four switch components 202. In preferably, each switch component 202 is metal-oxide-semiconductor field-effect transistor (MOSFET). The converters 200, the switching components 202 and the active or passive components 204 collectively construct a driving circuit.

The converting module 30 receives voltage source outputted by the driving module 20 and provides a function of voltage converting for reducing voltage value of the voltage source. A length of the converting module 30 is substantially equal to that of the first substrate 10 in the first axial direction A1, and a width of the converting module 30 is smaller than a length of first substrate 10 in the first axial direction A1.

The converting module 30 includes a second substrate 300, a third substrate 310, a forth substrate 320, a converting unit 330, a controlling unit 340, a signal-transmitting unit 350, an outputting unit 360, a first connector 370, a second connector 380, a third connector 390 and a forth connector 400.

The converting unit 330 is placed on a board of the first substrate 10 (which is opposite to where the driving module 20 is disposed) and is used for receiving the electric power outputted by the driving module 20. The converting unit 330 includes at least one converter 332 and multiple active or passive components (not shown) for collectively constructing a power modulating circuit.

The first connector 370 is mounted on the first substrate 10 which is the same side where the converting module 330 is placed, and electrically connected to the first substrate 10.

The second substrate 300 may be a PCB or a substrate provided with conductive traces (not shown). In more particular, the substrate mentioned above may be copper substrate, aluminum substrate, ceramic substrate or other substrate with good thermal conductivity. However, the second substrate 300 may also be combined PCB with copper slice or other material with good electrical conductivity. In preferably, the second substrate 300 is multi-layer (more than or equal to two layers) circuit board. The second substrate 300 is inserted into the main plate 50 and electrically connected thereto, such that the second substrate 300 is parallel to the first substrate 10. In addition, one end of the second substrate 300 has at least one pillar 302. The second substrate 300 can include one or more pillars 302. As a non-limiting example, the second substrate 300 includes two pillars 302. The pillars 302 are inserted into the grooves 52, such that the second substrate 300 is perpendicular to the main plate 50 and electrically connected thereto.

The controlling unit 340 is placed on the second substrate 300 and electrically connected thereto. The controlling unit 340 includes a plurality of controlling components 342, which can be active or passive components, for collectively constructing a circuit with controllable function. However, the controlling components 342 can be an integrated circuit (IC) with function of control.

The second connector 380 is mounted on the second substrate 300 and electrically connected to the controlling unit 340. In this embodiment, the second connector 380 is mounted on a lateral side of the second substrate 300 which is faced to where the first substrate 10 is disposed.

The third substrate 310 may be a PCB or a substrate provided with conductive traces (not shown). In more particular, the substrate mentioned above may be copper substrate, aluminum substrate, ceramic substrate or other substrate with good thermal conductivity. However, the third substrate 310 may also be combined PCB with copper slice or other material with good electrical conductivity. The third substrate 310 is disposed between the first substrate 10 and the second substrate 300, and is parallel to the first substrate 10. The signal-transmitting unit 350 including a plurality of electronic components 352 for constructing a signal-transmitting circuit is placed on the third substrate 310 and electrically connected thereto.

The third connector 390 is mounted on the third substrate 310 and electrically connected thereto. The third connector 390 is assembled with the first connector 370, such that the signal-transmitting unit 350 is electrically connected to converting unit 330.

The forth connector 400 is mounted on the third substrate 310 and electrically connected thereto. The forth connector 400 is assembled with the second connector 380, such that the signal-transmitting unit 359 is electrically connected to the controlling unit 340.

The forth substrate 320 may be a PCB or a substrate provided with conductive traces (not shown. In more particular, the substrate mentioned above may be copper substrate, aluminum substrate, ceramic substrate or other substrate with good thermal conductivity. However, the forth substrate 320 may also be combined PCB with copper slice or other material with good electrical conductivity. The forth substrate 320 is disposed at one side of the second substrate 300 which is opposite to where the third substrate 310 is disposed, and is substantially parallel to the second substrate 300. The forth substrate 320 is inserted into the main plate 50 and electrically connected thereto. One end of the forth substrate 320 includes at least one pillar 322. The forth substrate 320 can includes one or more pillars 322. As a non-limiting example, the forth substrate 320 includes three pillars 322. The pillars 322 are inserted into the grooves 52, such that the forth substrate 320 is perpendicular to the main plate 50 and electrically connected thereto.

The outputting unit 360 including at least one inductor 362 and at least one capacitor 364 is placed on the forth substrate 320 and electrically connected thereto. The outputting unit 360 can includes one or more inductors 362 and capacitors 364, respectively. As non-limiting example, the outputting unit 360 includes two inductors 362 and two capacitors 364. The inductors 362 and the capacitors 364 are collectively constructing a π-type filter for stabilizing outputting current and reducing outputting noise.

In the practical application, the user can adjust the specifications (such as rated working voltage) of the driving module 20, the converting unit 330, the controlling unit 340, the signal-transmitting unit 350 and the outputting unit 360 according to demanded outputting power, and the user can respectively insert the first substrate 10, the second substrate 300, the third substrate 310 and the forth substrate 320 (where the driving module 20, the converting unit 330, the controlling unit 340, the signal-transmitting unit 350 and the outputting unit 360 is disposed) into the main plate 50 and electrically connected to the main plate 50, and then assemble the first connector 370 and the second connector 380 with the third connector 390 and the forth connector 400, respectively, such that the converting unit 330 can electrically connect to the controlling unit 340 via the signal-transmitting unit 350. Therefore, the electric power inputting from the modular power device 1 can be converted into a demanded electric power, and outputted from the outputting unit 360. For this result, the modular power device 1 has advantages of easily fabricating and easily modulating specifications.

To sum up, the modular power device 1 has advantage of small volume, and the arrangement of the modular power device 1 can effectively isolate the outputting unit 360 from the converting unit 330, so as to reduce outputting power by interference from inputting power, and then stabilize outputting electric power. Besides, the space formed between each two substrate allows air flowing therethrough, such that the heat dissipating effect can be enhanced.

Figure 4:
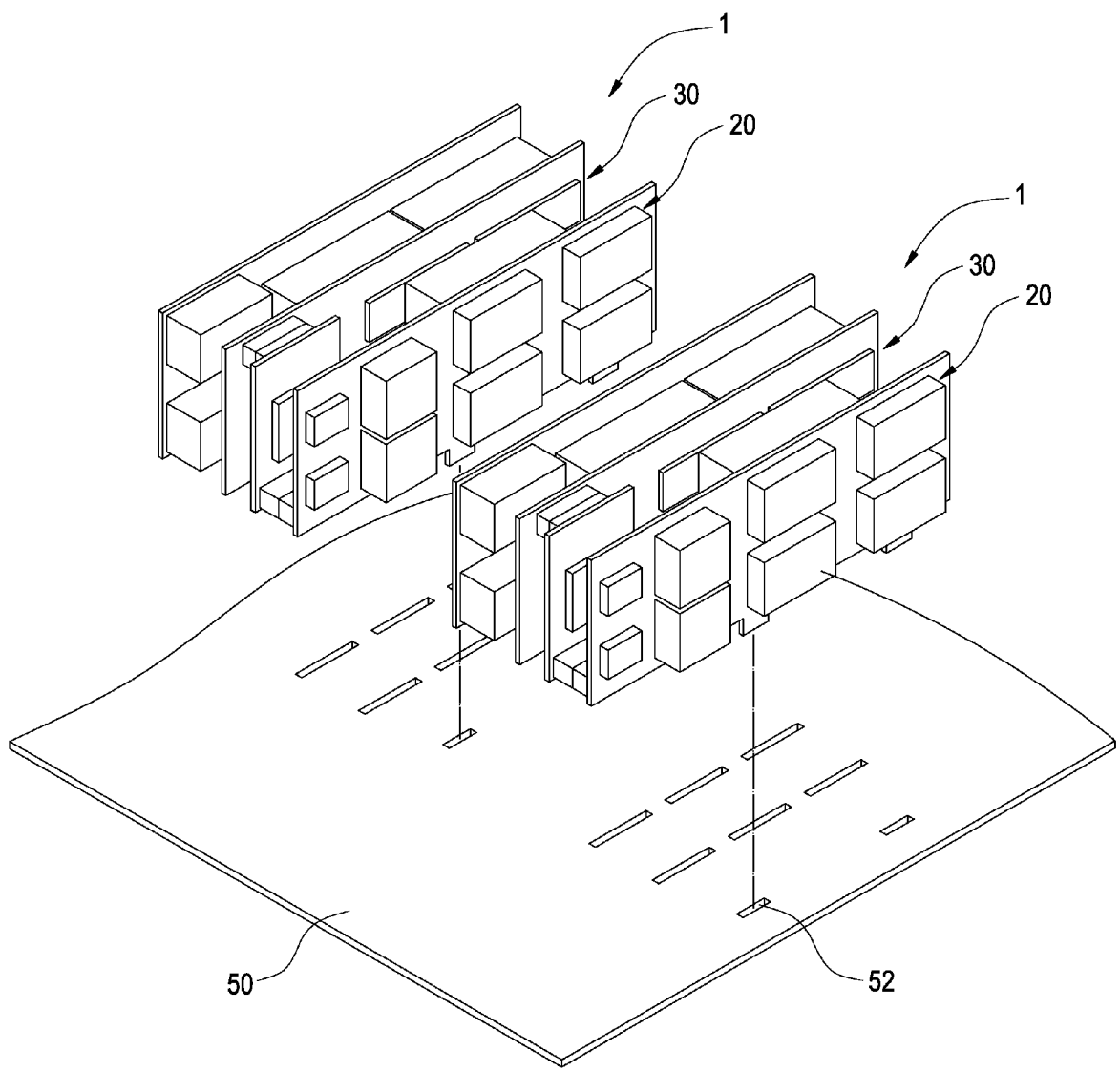
FIG. 4 is a perspective view of a power system according to a first embodiment of the present invention.

Reference is made to FIG. 4, which is a perspective view of a power system according to a first embodiment of the present invention. The power system includes a main plate 50 and a plurality of modular power devices 1 mentioned above. The modular power devices 1 are mounted on the main plate 50 and electrically connected thereto. In this embodiment, the power system includes, for example, two modular power devices 1, and the modular power devices 1 electrically connected in parallel are arranged in an alignment manner.

Therefore, when the power system is operated with light load, only one modular power device 1 is activated for reducing outputting electric power. When the power system is operated with heavy load, a plurality of modular power devices 1 are activated to increase outputting electric power. In addition, when activate more modular power devices 1, the controlling units 340 of the modular power devices 1 can collectively construct the function of phase-shift, such that the effect of power system can be enhanced, and the outputting ripple current is reduced. For this result, the power system can achieve optimal efficiency wherever operating with light load or heavy load, and prevent the problem of pool efficiency of high power system as operating with light load.

Figure 5:
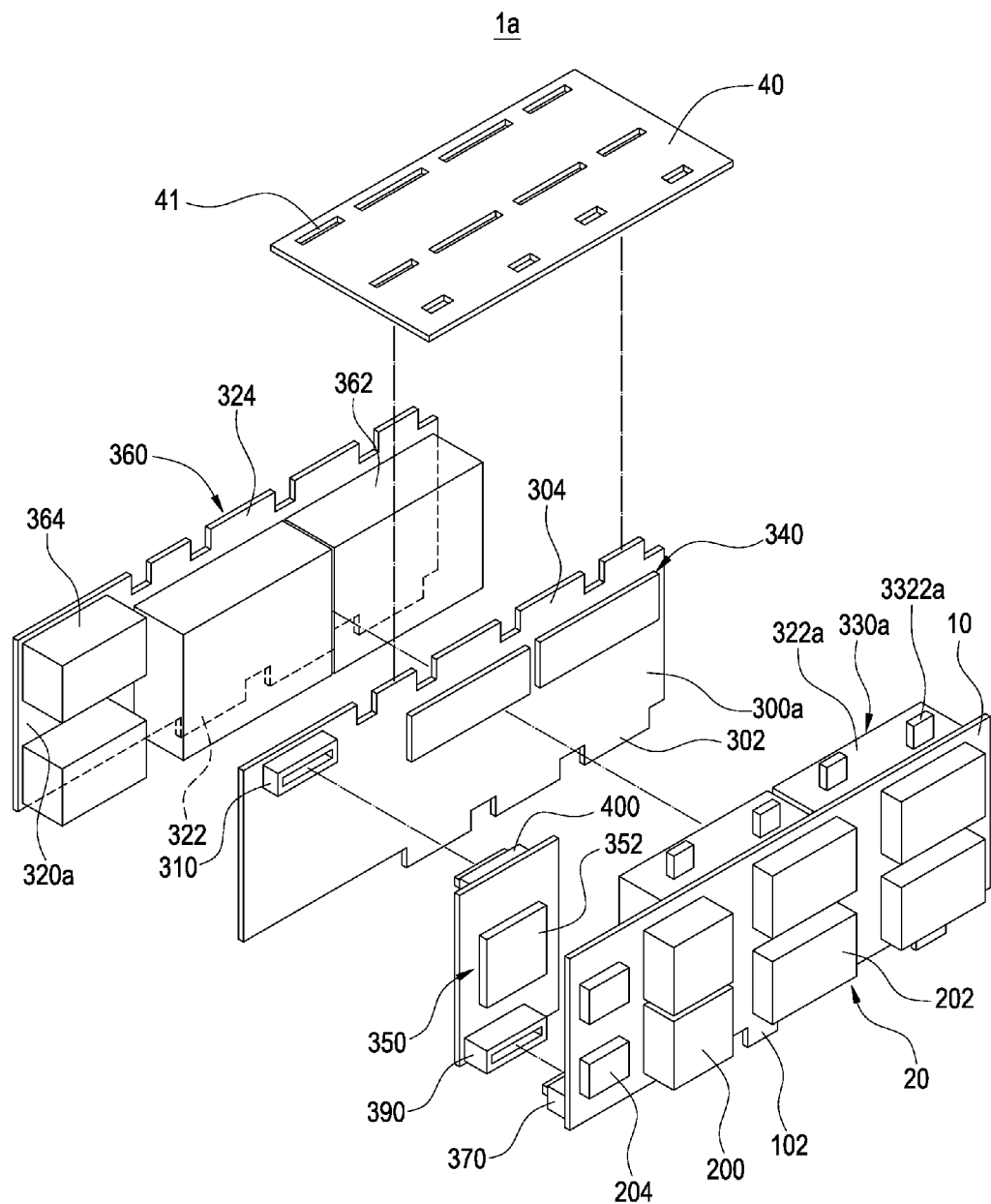
FIG. 5 is a perspective view of a modular power device according to a second embodiment of the present invention.
Figure 6:
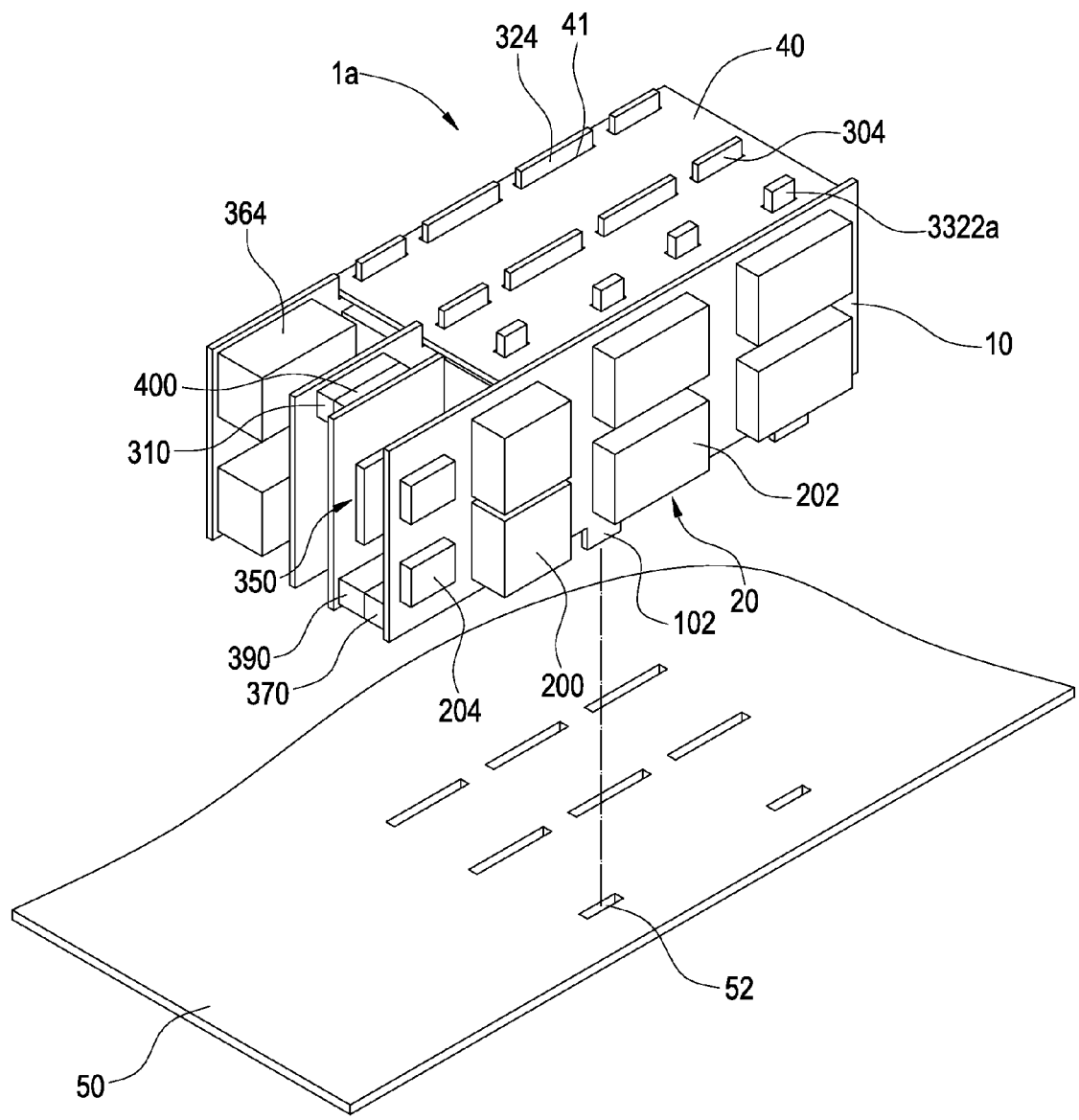
FIG. 6 is a perspective view of a modular power device and a main plate according to a second embodiment of the present invention.
Figure 7:
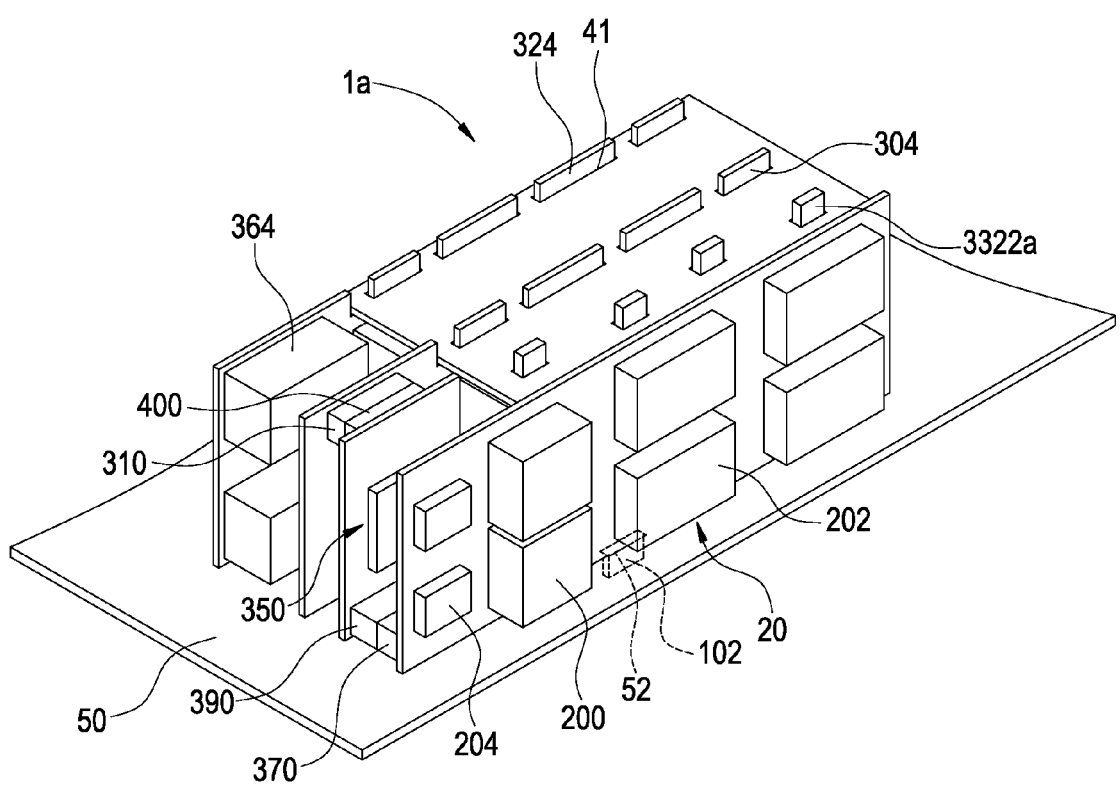
FIG. 7 is an assemble view of the modular power device and the main plate according to the second embodiment of the present invention.

Referring to FIG. 5 to FIG. 7, FIG. 5 is a perspective view of a modular power device according to a second embodiment of the present invention, FIG. 6 is a perspective view of a modular power device and a main plate according to a second embodiment of the present invention, and FIG. 7 is an assemble view of the modular power device and the main plate according to the second embodiment of the present invention. The modular power device 1a is similar to the modular power device 1 mentioned above, and the same reference numbers are used in the drawings and the description to refer to the same parts.

The modular power device 1a further includes an intermediate plate 40. The intermediate plate 40 may be a PCB or a substrate provided with conductive traces (not shown). In more particular, the substrate mentioned above may be copper substrate, aluminum substrate, ceramic substrate or other substrate with good thermal conductivity. However, the intermediate plate 40 may also be combined PCB with copper slice or other material with good thermal conductivity. A plurality of accommodating slots 41 are formed on the intermediate plate 40.

In addition, one end the second substrate 300a which is opposite to where the pillars 302 are formed has at least one rib 304. The second substrate 300a can includes one or more ribs 304. As non-limited example, the second substrate 300a includes four ribs 304. The ribs 304 are inserted into the accommodating slots 41 formed on the intermediate plate 40, such that the second substrate 300a is substantially perpendicular to the intermediate plate 40 and electrically connected thereto.

One end of the forth substrate 320a which is opposite to where the pillars 322 are formed has at least one rib 324. The forth substrate 320a can includes one or more ribs 324. As non-limiting example, the forth substrate 320a includes four ribs 324. The ribs 324 are inserted into the accommodating slots 41, such that the forth substrate 320a is substantially perpendicular to the intermediate plate 320a and electrically connected thereto.

Each converter 332a of the converting unit 330a has at least one protrusion 3322a. The converter can include one or more protrusions 3322a. As non-limiting example, each converter 330a includes two protrusions 3322a. The protrusions 3322a are inserted into the accommodating slots 41 of the intermediate plate 40, and then electrically connect the intermediate plate 40 and the converting unit 330a.

Thereby, the controlling unit 340 placed on the second substrate 300a and the outputting unit 360 placed on the forth substrate 320a are electrically connected to the converting unit 330a and the driving module 20 via the main plate 50 and the intermediate plate 40. Preferably, the potentials transmitted by the main plate 50 and the intermediate plate 40 are different in level.

The function and relative description of other components of the module power device 1a is the same as that of first embodiment mentioned above and are not repeated here, and the modular power device 1a can fulfill the functions as the modular power device 1 does.

Besides, a power system may be constructed by the main plate 50 and a plurality of modular power devices 1a. The arrangement of the modular power devices 1a is the same as the modular power devices 1 mentioned above and its description is not repeated here.

Figure 8:
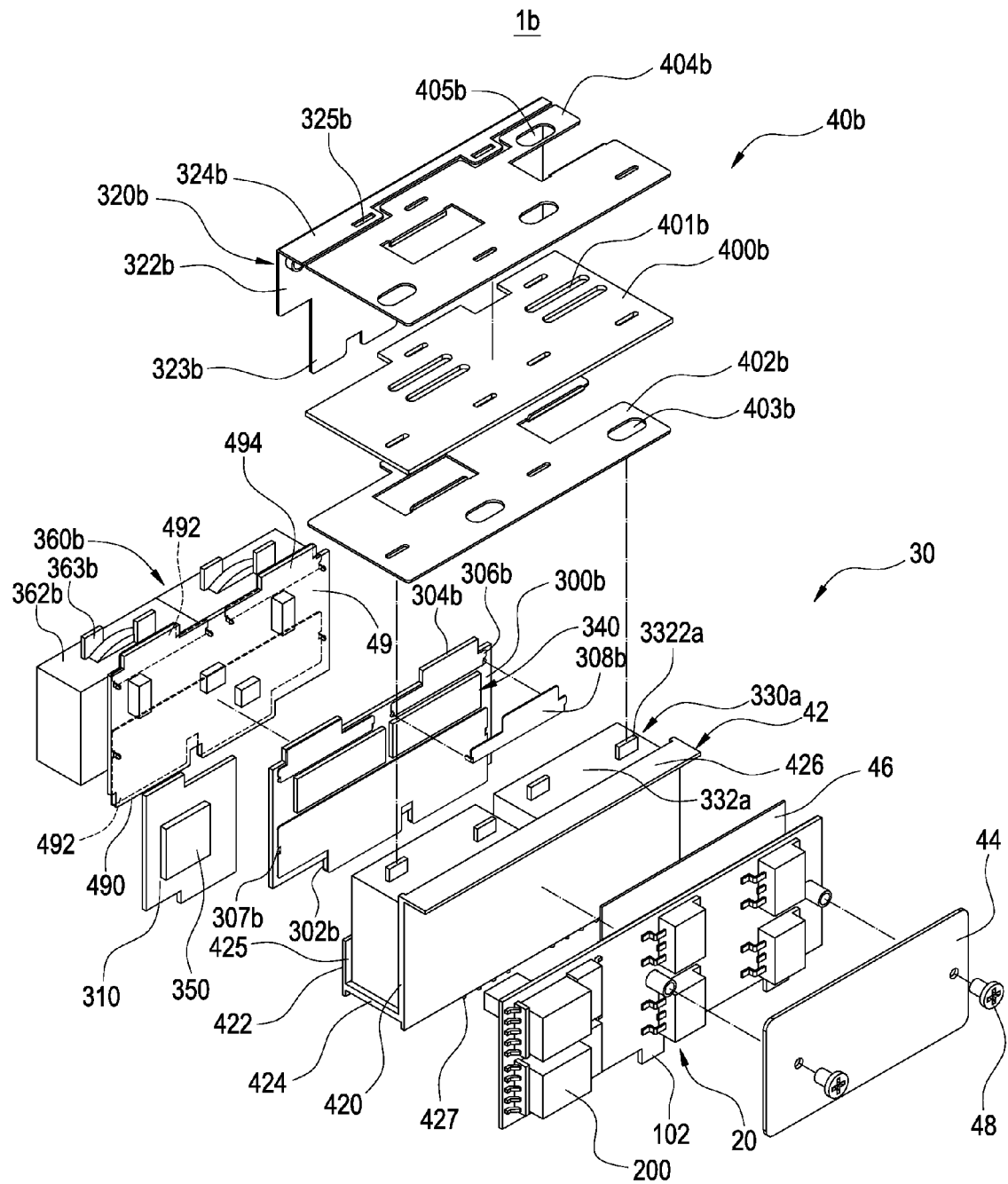
FIG. 8 is a perspective view of a modular power device according to a third embodiment of the present invention.
Figure 9:
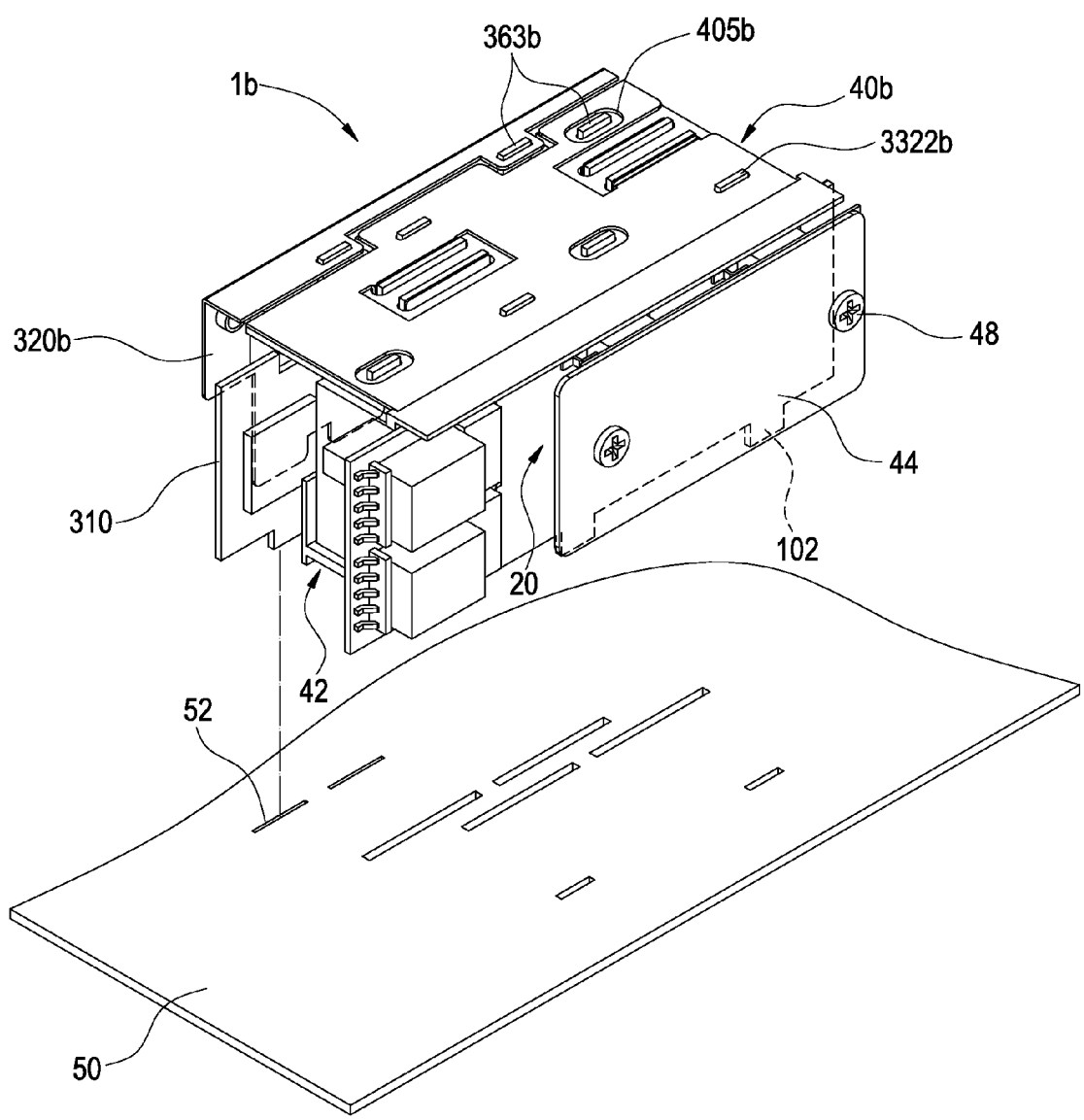
FIG. 9 is a perspective view of a modular power module and a main plate according to the third embodiment of the present invention.

Referring to FIG. 8 and FIG. 9, FIG. 8 is respectively a perspective view of a modular power device according to a third embodiment of the present invention, and FIG. 9 is an assemble view of a modular power device according to the third embodiment of the present invention. The modular power device 1b is similar to the modular power device 1a mentioned above, and the same reference numbers are used in the drawings and the description to refer to the same parts.

It should be noted that the second substrate 300b is a multi-layer circuit board and a plurality of engaging slots 306b are formed thereon for disposing a plurality of electric layers 308a therein. Preferably, a plurality of engaging parts 307b are respectively formed on a wall of each engaging slot 306b for fastening each electric layer 308b. Each electric layer 308b is made of capper or other material with good electrical conductivity and used as current transmitting routes.

The intermediate plate 40b includes a multi-layer circuit board 400b, a first metallic layer 402b and the second metallic layer 404b. Multiple through holes 401b are formed on the multi-layer circuit board 400b. The first metallic layer 402b and the second metallic layer 404b are made of copper or other material with good electrical conductivity and used as current transmitting routes.

The first metallic layer 402b is attached to a lower surface of the multi-layer circuit board 400b, and a plurality of first holes 403b corresponding to the through holes 401b are formed thereon. The second metallic layer 404b is attached to an upper surface of the multi-layer circuit board 400b, and a plurality of second holes 405b corresponding to the through holes 401b are formed thereon.

The protrusions 3322a of the converters 332a and the ribs 304b of the second substrate 300b are inserted into the through holes 401b, the first holes 403b and the second holes 405b, and electrically connected to the intermediate plate 40b.

The forth substrate 320a includes a flat part 322b and a bent part 324b. The flat part 322b is parallel to the first substrate 10 and has a plurality of pillars 323b for inserting into the main plate 50, such that the firth substrate 320b is electrically connected to the main plate 50. The bent part 324b is substantially perpendicular to the flat part 322b and a plurality of openings 325b are formed thereon. A plurality of pins 363b of each inductor 362b of outputting unit 360b are inserted into the openings 325b of the forth substrate 320b, the through holes 401b of the intermediate plate 40b, the first holes 403b and the second holes 405b, such that the forth substrate 320b is electrically connected to the intermediate plate 40b.

The modular power device 1b further comprises a carrier 42, a first isolating and thermal-dissipating board 44, a second isolating and thermal-dissipating board 46, a plurality of fixing component 48 and a fifth substrate 49. The carrier 42 includes a first board 420, a second board 422, a connecting part 424 and a shoulder-part 426. The first board 420 is disposed adjacent to the first substrate 10, and the second board 422 is disposed adjacent to the second substrate 300b. In his embodiment, the first board 420 and the second board 422 are of rectangular shape, a length of the second board 422 is substantially equal to that of the first board 420, and a width of the second board 422 is smaller than that of the first board 420. The connecting part 424 is located at one end of the first board 420 and the second board 422 and connected thereof. The first board 420, the second board 422 and the connecting part 424 collectively construct an accommodating space 425 for accommodating the converter 332a of the converting unit 330a, so as to prevent the converters 332a from electromagnetic interference produced by the converters 200 of the driving module 20. The connecting part 424 further includes a plurality of supporting components 427 for inserting into the main plate 50. The shoulder-part 426 is disposed on one end of the first board 420, which is opposite to where the connecting part 424 is disposed, and extending toward a direction where the first substrate 10 is disposed for disposing the carrier 42 on the first substrate 10. The first isolating and thermal-dissipating board 44 is disposed in one side of the first substrate 10, the second isolating and thermal-dissipating board 46 is disposed on the other side of the first substrate 10. The fixing component 48 penetrates the first isolating and thermal-dissipating board 44 and is fastened on the second isolating and thermal-dissipating board 46 so as to provide electromagnetic isolating effect and thermal-dissipating effect.

The fifth substrate 49 is disposed at one side of the second substrate 300b which is opposite to where the first substrate 10 is disposed. The fifth substrate 49 is a PCB or a substrate provided with conductive traces (not shown). In more particular, the substrate mentioned above may be copper substrate, aluminum substrate, ceramic substrate or other substrate with good thermal conductivity. However, the fifth substrate 49 may also be combined PCB with copper slice or other material with good thermal conductivity. Preferably, the fifth substrate 49 is multi-layer (more than or equal to two layers) circuit board. At least one pillar 490 is formed at one end of the fifth substrate 49. The fifth substrate 49 can include one or more pillars 490. As non-limiting example, the fifth substrate 49 includes two pillars 490. The pillars 490 are inserted into the intermediate plate 40b and electrically connected thereto. At least one rib 494 formed on the other end of the fifth substrate 49 is inserted into the main plate 50 and electrically connected to the main plate 50.

The fifth substrate 49 further includes at least one electric layer 492 for functioning as routes of current transmitting. The controlling unit 340 is simultaneously disposed on the second substrate 300b and the fifth substrate 49 and electrically connected thereto. For this result, the controlling elements of the controlling unit 340 can disposed with intervals for enhancing the effect of thermal-dissipation.

The function and relative description of other components of the module power device 1b is the same as that of second embodiment mentioned above and are not repeated here, and the modular power device 1b can fulfill the functions as the modular power device 1a does.

Besides, a power system may be constructed by the main plate 50 and a plurality of modular power devices 1b. The arrangement of the modular power devices 1b is the same as the modular power devices 1 mentioned above and the description thereof is not repeated here.

Figure 10:
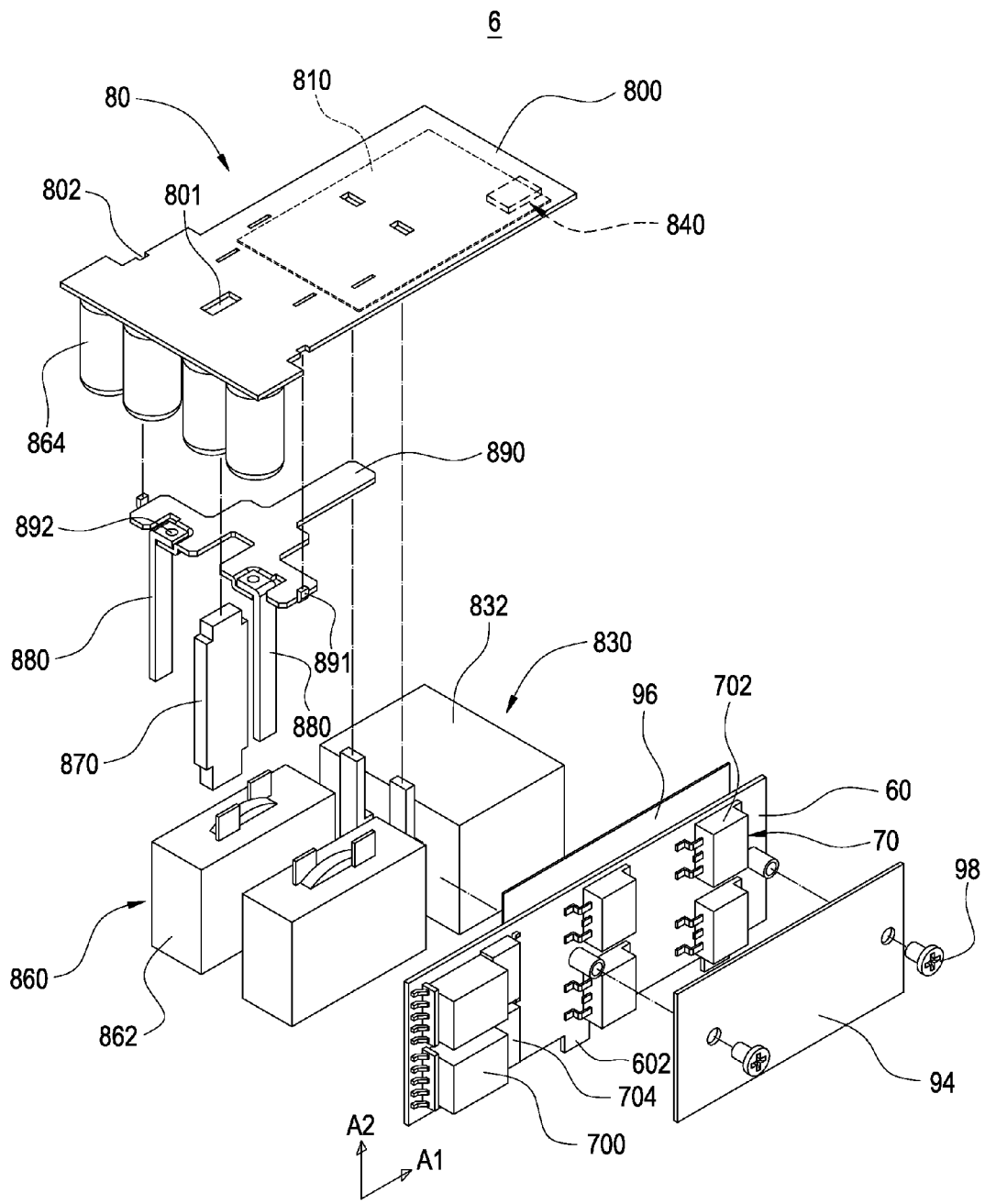
Figure 11:
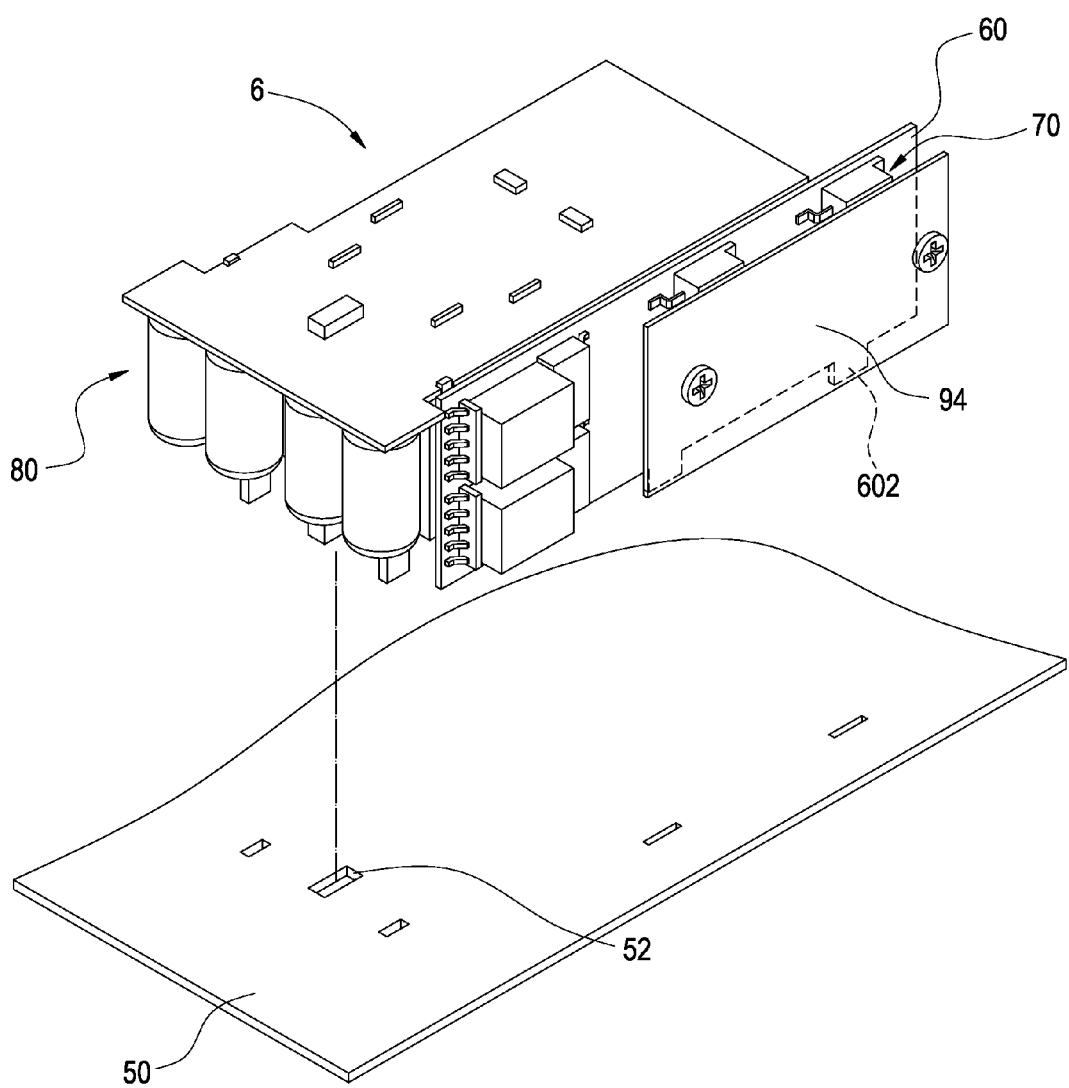
FIG. 11 is a perspective view of a modular power device and a main plate according to the forth embodiment of the present invention.

Referring to FIG. 10 and FIG. 11, FIG. 9 is a perspective view of a modular power device and main plate according to a forth embodiment of the present invention, and FIG. 10 is an assemble view of a modular power device and main plate according to the forth embodiment of the present invention. The modular power device 6 is used for mounting on a main plate 50. The main plate 50 has a plurality of grooves 52 through which the modular power device 6 is inserted therein. The main plate 50 may be a printed circuit board (PCB) or a substrate provided with conductive traces (not shown), and the substrate mentioned above may be copper substrate, aluminum substrate, ceramic substrate or other substrate with good thermal conductivity. However, the main plate 50 may also be combined PCB with copper slice or other material with good electrical conductivity.

The modular power device 6 includes a first substrate 60, a driving module 70 and a converting module 80. The converting module 70 is placed on one side of the first substrate 60 and electrically connected the first substrate 60. The converting module 80 is located at the other side of the first substrate 60, and electrically connected to the driving module 70.

The first substrate 60 may be a (PCB) or a substrate provided with conductive traces (not shown), and the substrate mentioned above may be copper substrate, aluminum substrate, ceramic substrate or other substrate with good thermal conductivity. However, the first substrate 60 may also be combined PCB with copper slice or other material with good thermal conductivity. The first substrate 60 has a first axial direction A1 and a second axial direction A2 substantially perpendicular to the first axial direction A1. In this embodiment, the first axial direction A1 is lengthwise direction of the first substrate 60, and the second axial direction A2 is widthwise direction of the first substrate 60. The first substrate 60 is inserted into the main plate 50, such that the second axial direction A2 of the first substrate 60 is substantially perpendicular to a board 54 of the main plate 50. An end of the first substrate 60 has at least one pillar 602. The first substrate 60 can include one or more pillars 602. As non-limiting examples, the first substrate 60 includes two pillars 602. The pillars 602 are inserted into the grooves 52, such that the first substrate 60 is substantially perpendicular to the main plate 50 and electrically connected thereto.

The driving module 70 is directly placed on the first substrate 60 and electrically connected thereto. The driving module 70 receives electric power inputting to the modular power device 6 and drives thereof. The driving module 70 includes at least one converter 700, at least one switch 702 and a plurality of active and passive components 704. The driving module 70 can include one or more converters 700 and switch components 702, respectively. As a non-limiting example, the driving module 70 includes two converters 700 and four switches 702, and each switch 702 is MOSFET. The converters 700, the switches 702 and the active or passive components 704 collectively construct a driving circuit.

The converting module 80 receives voltage source passing through the driving module 70 and provides the function of voltage converting so as to reduce the voltage value of the voltage source. A length of the converting module 80 is substantially equal to that of the first substrate 60 in the first axial direction A1, and a width of the converting module is smaller than a length of the first substrate 60 in the first axial direction A1.

The converting module 80 includes a second substrate 800, at least one conductive layer 810, a converting unit 830, a controlling unit 840, an outputting unit 860, a first connecting post 870, two second connecting posts 880 and an electric layer 890.

The second substrate 800 is disposed opposite to the main plate 50. The second substrate 800 may be a PCB or a substrate provided with conductive traces (not shown), and the substrate mentioned above may be copper substrate, aluminum substrate, ceramic substrate or other substrate with good thermal conductivity. However, the second substrate 800 may also be combined PCB with copper slice or other material with good thermal conductivity. Preferably, the second substrate 800 is multi-layer (more than or equal to two layers) circuit board.

The conductive layer 810 is made of copper of other material with good electrical conductivity. The conductive layer 810 is attached to the second substrate 800 for functioning as route of current transmission. Preferably, a containing slot (not shown) is formed on the second substrate 800 for containing the conductive layer 810 and fastening the conductive layer 810.

The converting unit 830, the controlling unit 840 and the outputting unit 860 are placed on the second substrate 800 and electrically connected thereto. The converting unit 830 receives the power outputted by the driving module 70 and converts the outputted power into a demand voltage value. The converting unit 830 includes at least one converter 832 and a plurality of action or passive components (not shown). The converter 832 and the active or passive components collectively construct a voltage-converting circuit.

The controlling unit 840 is used for controlling the operating state of the modular power device 6. The controlling unit 840 includes multiple controlling components for constructing a controlling circuit. However, the controlling unit 840 may be a integrate circuit (IC) with controlling function. The outputting unit 860 includes at least one inductor 862 and at least one capacitor 864. The outputting unit 860 can include one or more inductors 862 and capacitors 864, respectively. As non-limiting example, the outputting unit 860 includes two inductors 862 and four capacitors 864. The inductors 862 and the capacitor 864 collectively construct a π-type filter for stabilizing outputting current and reducing outputting noise.

The first connecting post 870 is located between the main plate 50 and the second substrate 800, and inserted into the grooves 52 of the main plate 50 and the through hole 801 of the second substrate 800, and electrically connected to the main plate 50 and the second substrate 800.

The electric layer 980 is made of copper of other material with good electrical conductivity. The electric layer 810 is attached to the second substrate 800 for providing connective path between the outputting unit 860 and the second substrate 800, and then current can flow between the outputting unit 860 and the second substrate 800. A plurality of buckles 891 are formed on the electric layer 980, the buckles 891 are locked on a plurality of positioning slots 802 formed on the second substrate 800 for achieving the effect of position and enhancing the connecting strength of the electric layer 890 and the second substrate 800. In this embodiment, the electric layer 890 is of T-shape. In the practical application, the profile of the electric layer 890 may be adjusted by demand.

The electric layer 890 is connected to each second post 880 through at least one connecting component 892. The connecting component 892 is preferably rivet for riveting the electric layer 890 to one end of each second connecting post 880, such that current can transmit between the electric layer 890 and the second connecting posts 880. The other end of each second connecting post 880 is inserted into the groove 52 of the main plate 50 and electrically connected to the main plate 50, such that electric power can transmit between the main plate 50 and the second substrate 800 via second connecting posts 880. Preferably, the potentials transmitted by the second connecting posts 880 and the first connecting post 870 are different in level.

The modular power device 6 further comprises a first isolating and thermal-dissipating board 94, a second isolating and thermal-dissipating board 96 and a plurality of fixing components 98. The first isolating and thermal-dissipating board 94 is disposed in one side of the first substrate 60, the second isolating and thermal-dissipating board 96 is disposed on the other side of the first substrate 60. The fixing components 98 penetrate the first isolating and thermal-dissipating board 94 and fastened on the second isolating and thermal-dissipating board 96 so as to provide electromagnetic isolating and thermal-dissipating effect.

To sun up, the modular power device 6 has advantage of small volume and air can flow therein to enhance heat dissipating effect.

In the practical application, the user can adjust the specifications (such as rated working voltage) of the driving module 70, the converting unit 830, the controlling unit 840 and the outputting unit 860 according to demanded outputting power. Therefore, the electric power inputting from the modular power device 6 can be converted into a demanded electric power, and output from the outputting unit 860. For this result, the modular power device 6 has advantages of easily fabricating and easily modulating specifications.

Figure 12:
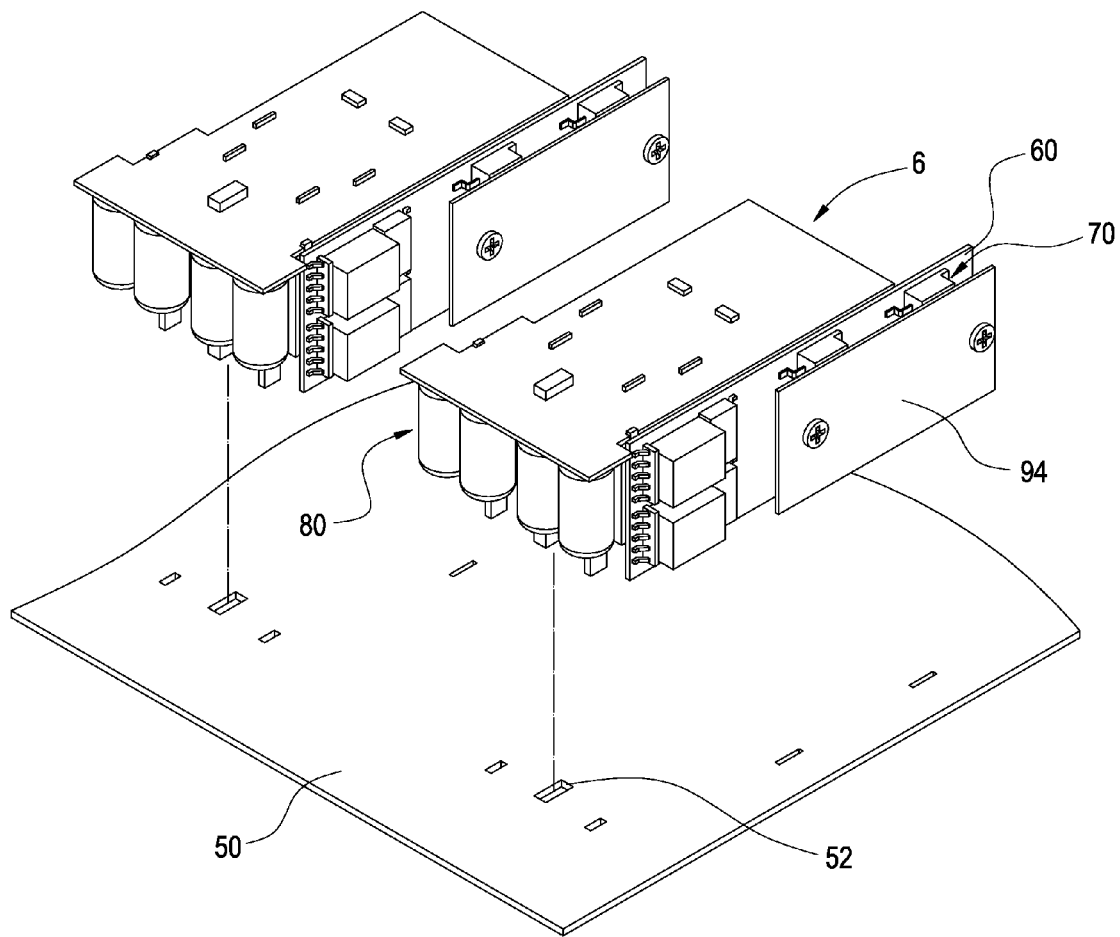
FIG. 12 is a perspective view of a power system according to a second embodiment of the present invention.

Reference is made to FIG. 12, which is a perspective view of a power system according to a second embodiment of the present invention. The power system includes a main plate 50 and a plurality of modular power devices 6 mentioned above. The modular power devices 6 are mounted on the main plate 50 and electrically connected thereto. In this embodiment, the power system includes, for example, two modular power devices 6, and the modular power devices 6 electrically connected in parallel are mounted on the main plate 50 in an alignment manner.

Therefore, when the power system is operated with light load, only one modular power device 6 is activated for reducing outputting electric power. When the power system is operated with heavy load, a plurality of modular power devices 6 are activated to increase outputting electric power. In addition, when activate more modular power devices 6, the controlling units 840 of the modular power device 6 can collectively construct the function of phase-shift, such that the effect of power system can be enhanced, and the outputting current ripple can be reduced. For this result, the power system can achieve optimal efficiency wherever operating with light load or heavy load, and prevent the problem of pool efficiency of high power system as operating with light load.

Although the present invention has been described with reference to the foregoing preferred embodiment, it will be understood that the invention is not limited to the details thereof. Various equivalent variations and modifications can still occur to those skilled in this art in view of the teachings of the present invention. Thus, all such variations and equivalent modifications are also embraced within the scope of the invention as defined in the appended claims.

What is claimed is:

1. A modular power device is used for mounting on a main plate, the modular power device comprising:
   a first substrate having a first axial direction and a second axial direction perpendicular to the first axial direction, the first substrate inserted into the main plate, such that the second axial direction is perpendicular to the main plate;
   a driving module placed on one side of the first substrate and electrically connected to the first substrate; and
   a converting module located on the other side of the first substrate and electrically connected to the driving module, the converting module comprising:
      a second substrate inserted into the main plate and perpendicular to the main plate;
      a third substrate located between the first substrate and the second substrate;
      a converting unit disposed on the first substrate;
      a controlling unit placed on the second substrate and electrically connected to the second substrate;
      a signal transmitting unit placed on the third substrate and electrically connected to the third substrate for electrically connecting the controlling unit and the converting unit; and
      an outputting unit electrically connected to main plate;
   wherein a length of the converting module is equal to that of the first substrate in the first axial, and a width of the converting module is smaller than a length of first axial direction of the first substrate.

2. The modular power device in claim 1, further comprising a forth substrate located at one side of the second substrate which is opposite to where the third substrate is disposed, the forth substrate inserted into the main plate and perpendicular to the main plate, the outputting unit placed on the forth substrate and electrically connected to the forth substrate.

3. The modular power device in claim 1, wherein the outputting unit comprises at least one capacitor and at least one inductor.

4. The modular power device in claim 1, wherein the converting unit further comprises:
   a first connector mounted on the first substrate;
   a second connector mounted on the second substrate;
   a third connector mounted on the third substrate and assembled with the first connector for electrically connecting the signal transmitting unit and the converting unit; and
   a forth connector mounted on the third substrate and assembled with the second connector for electrically connecting the signal transmitting unit and the controlling unit.

5. The modular power device in claim 2, wherein one end of the first substrate, the second substrate and the forth substrate has at least one pillar, each pillar is inserted into at least one groove formed on the main plate and electrically connected to the main plate.

* * * * *